United States Patent
Tseng et al.

[11] Patent Number: 5,949,547
[45] Date of Patent: *Sep. 7, 1999

[54] SYSTEM FOR IN-LINE MONITORING OF PHOTO PROCESSING IN VLSI FABRICATION

[75] Inventors: Huan-Chi Tseng; Chia-Hsiang Chen; Han-Liang Tseng, all of Hsin-Chu, Taiwan

[73] Assignee: Taiwan Semiconductor Manufacturing Company, Ltd., Hsin-Chu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 08/803,352

[22] Filed: Feb. 20, 1997

[51] Int. Cl.$^6$ .............................. G01B 11/14; G01J 1/00; G01N 21/86; H01L 23/544

[52] U.S. Cl. ................. 356/375; 250/491.1; 250/559.37; 250/559.38; 257/797

[58] Field of Search ............................... 356/139.03, 375, 356/401; 250/491.1, 559.3, 559.37, 559.38; 257/797

[56] References Cited

U.S. PATENT DOCUMENTS

| | | | |
|---|---|---|---|
| 5,248,876 | 9/1993 | Kerstens et al. | 250/561 |
| 5,439,767 | 8/1995 | Yamashita et al. | 430/30 |
| 5,447,810 | 9/1995 | Chen et al. | 430/5 |
| 5,483,056 | 1/1996 | Imai | 250/201.4 |
| 5,496,669 | 3/1996 | Pforr et al. | 430/22 |
| 5,556,726 | 9/1996 | Yuan | 430/30 |
| 5,747,202 | 5/1998 | Tanaka | 430/30 |

*Primary Examiner*—Stephen C. Buczinski
*Attorney, Agent, or Firm*—George O. Saile; Stephen B. Ackerman; Larry J. Prescott

[57] ABSTRACT

An integrated de-focus pattern provides an effective in-line monitor of de-focus and relative tilt for photo processing steps of integrated circuit wafers. The de-focus pattern is formed on an integrated circuit wafer in the vertical and horizontal spaces between integrated circuit chips. The de-focus pattern has a number of different test patterns at different heights above the wafer surface. De-focus patterns are placed across the entire wafer surface. The de-focus patterns are formed at the same time the features of the circuit chips are formed. The de-focus patterns can be analyzed optically or using a scanning electron microscope.

7 Claims, 6 Drawing Sheets

SYSTEM FOR IN-LINE MONITORING OF PHOTO PROCESSING IN VLSI FABRICATION

BACKGROUND OF THE INVENTION

(1) Field of the Invention

This invention relates to the in-line monitoring of photo processing steps in integrated circuit wafer fabrication and, more particularly, to the use of a de-focus pattern formed on the wafer between circuit chips to monitor photo process steps.

(2) Description of the Related Art

U.S. Pat. No. 5,556,726 to Yuan describes a method of determining quantitatively the exposure levels for photoresists using a specially designed grating on a mask.

U.S. Pat. No. 5,496,669 to Pforr et al. describes a latent image detection device comprising an alignment device intended for aligning the mask pattern with respect to the substrate. The invention also describes a focus test pattern on the product wafer that allows in-line measurement of substrate height and focus.

U.S. Pat. No. 5,447,810 to Chen et al. describes a method of using off-axis illumination mask to increase depth of focus and minimize critical dimension differences between some features.

U.S. Pat. No. 5,439,767 to Yamashita et al. describes a method of inspecting the transmittance error of a phase shift mask.

U.S. Pat. No. 5,483,056 to Imai describes a method of detecting an amount of de-focus for a projection exposure system using a focus detection system. A substrate is then loaded into the system and moved to a predetermined height by a Z-stage movable in the axial direction, using the amount of de-focus information, thereby exposing the shot area of the mask to the mask pattern.

TSMC-96-161, Serial No. , Entitled "Opposite Focus Control to Avoid Keyholes Inside a Passivation Layer," assigned to the same signee, describes the use of intentional de-focus to avoid keyholes or areas having a trapezoidal cross section in a dielectric layer.

The present invention describes a de-focus test pattern and a method for in-line monitoring of photo processing steps in the fabrication of integrated circuit wafers. The de-focus pattern is located on the product wafer and is formed as the product wafer is formed. The de-focus pattern has test patterns at a number of heights above the surface of the integrated circuit wafer. The amount of de-focus of a particular process can be readily monitored in-line. The de-focus pattern is located at the edges of a field so the relative tilt between the wafer and a photo mask can readily be monitored.

SUMMARY OF THE INVENTION

The tolerance requirements of stepper systems used to form photo images on layers of photoresist become more and more restrictive as the critical device lengths shrink into the sub-micron region. Image de-focus, caused by pattern height variation due to such causes as under-pattern morphology, and tilt, due to any non planarity between the wafer surface and the reference plane of the stepper, become more and more important. Conventional methods of monitoring these systems use off-line monitoring with special monitor wafers. These conventional methods can produce data reflecting performance of the stepper machine, but they may not correlate with process results on actual product wafers.

It is a principle objective of this invention to provide a de-focus and tilt monitor pattern which can be used to monitor de-focus and tilt.

It is another principle objective of this invention to provide an integrated circuit wafer having a de-focus and tilt pattern formed between active chip areas which can be used to monitor de-focus and tilt on a product wafer.

It is another principle objective of this invention to provide a method of monitoring de-focus and tilt on an integrated circuit wafer using a de-focus and tilt pattern.

These objectives are achieved by using a de-focus pattern formed in the spaces between the active chips on production integrated circuit wafers. The de-focus patterns use a number of test patterns which represent critical pattern shapes and dimensions, such as a number of closely spaced, parallel lines or a contact hole array pattern. The de-focus patterns are constructed to provide a number of pattern heights relative to the surface of the integrated circuit wafer and a range of critical dimensions such as line width, spacing between lines, contact hole size, and contact hole spacing. The test pattern heights are provided by actual circuit processing steps so an accurate representation of the product wafer conditions is realized.

The test patterns are formed on the actual integrated circuit wafer in the spaces between the active circuit chips. FIG. 1 shows a top view of an integrated circuit wafer 10 having a number of integrated circuit chips 12 and test patterns 11 formed thereon. The test patterns see the actual wafer processing as the integrated circuit wafer. Since the test patterns can be placed at the four corners of a field relative tilt between the integrated circuit wafer and the stepper system can be monitored. The test patterns cover a range of dimensions at each height. This allows the effect of de-focus on critical patterns to be observed directly. The evaluation of the test patterns can be carried out visually or using a scanning electron microscope, SCM.

DESCRIPTION OF THE PREFERRED EMBODIMENTS

Figure 1:
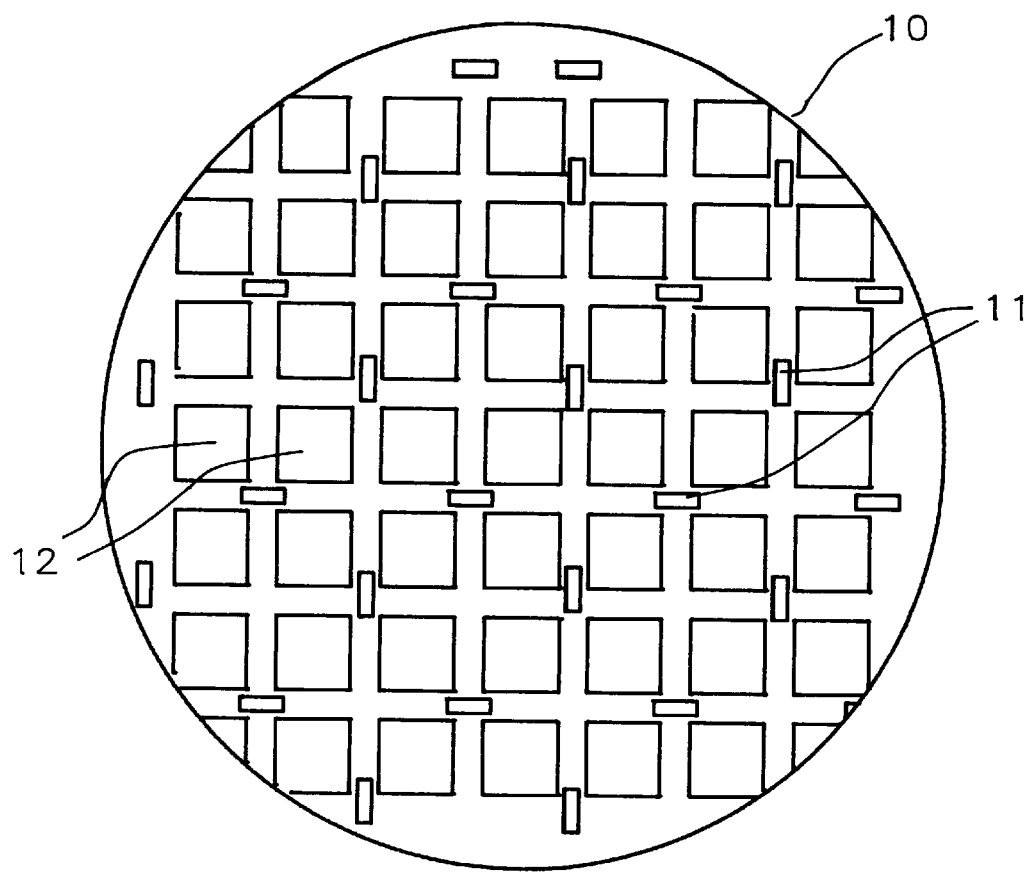
FIG. 1 shows a top view of an integrated circuit wafer showing the integrated circuit chips and the de-focus test patterns.

Refer now to FIGS. 1–8 for a description of the de-focus test pattern of this invention. FIG. 1 shows a top view of an integrated circuit wafer 10 having a number of integrated circuit chips 12 arranged in horizontal rows and vertical columns. There are a number of horizontal spaces between adjacent horizontal rows and vertical spaces between vertical columns. The de-focus test patterns 11 are places across the wafer in the horizontal spaces and the vertical spaces. The de-focus test patterns do not consume wafer area allocated to the integrated circuit chips since they are in what will become the kerf region when the wafer is cut into chips.

Figure 2:
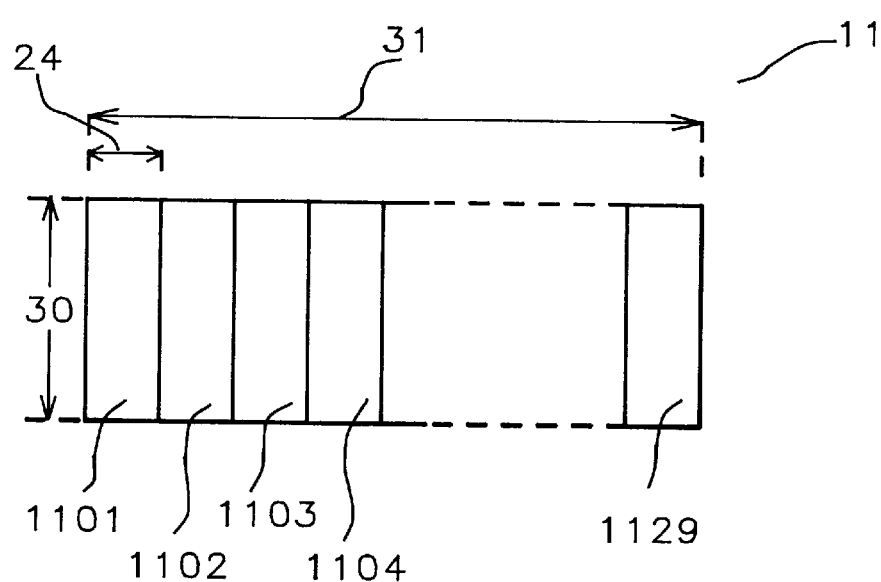
FIG. 2 shows a diagram of the make-up of the de-focus test pattern.

FIG. 2 shows a diagram of the de-focus test pattern made up of a number of de-focus strips 1101, 1102, 1103, 1104, . . . , 1129. FIG. 2 shows 29 of these de-focus strips however the number can be adjusted to fit the needs of the data desired. The width of the de-focus test pattern 30 in this example is between about 120 and 180 micrometers. The width 24 of each de-focus strip is between about 16 and 24 micrometers. The length 31 of the de-focus test pattern will depend on the number of de-focus strips. In this example the length 31 of the de-focus test pattern is between about 460 and 700 micrometers.

Figure 3:
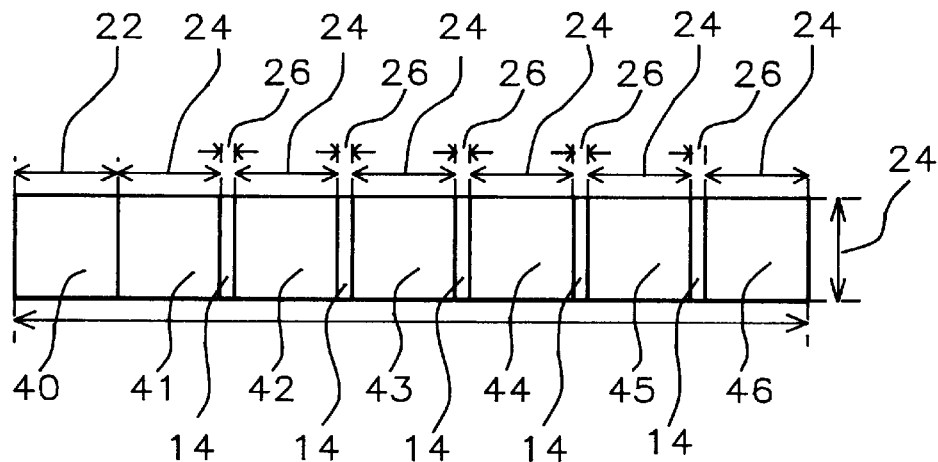
FIG. 3 shows a diagram of the make-up of one of the de-focus strips.
Figure 7:
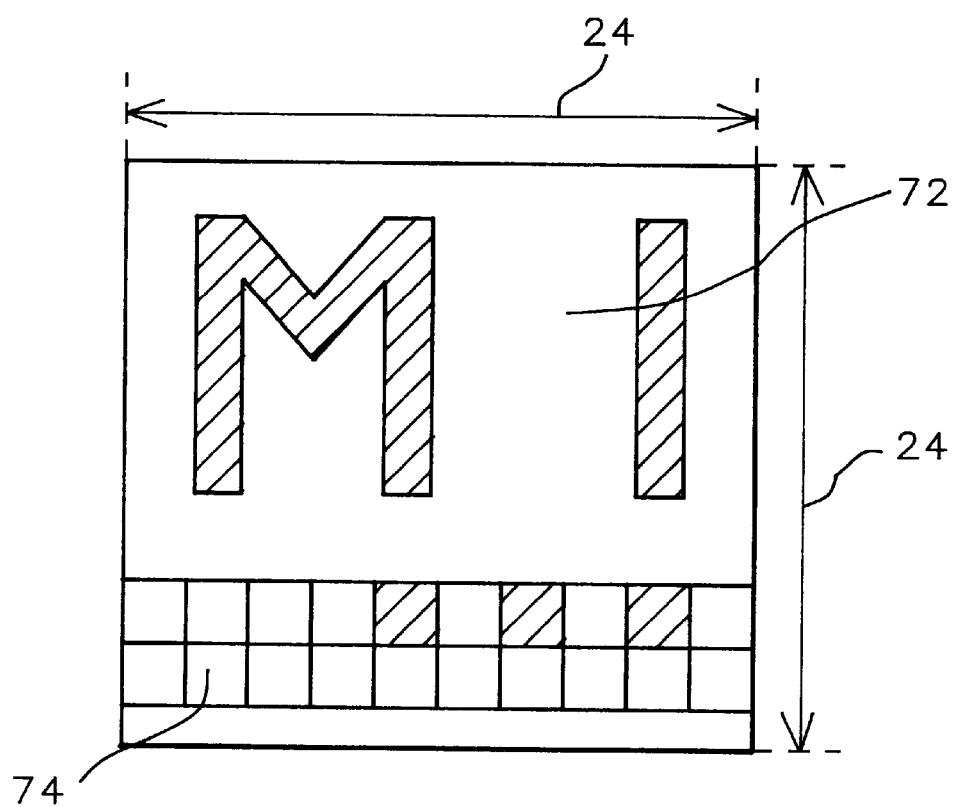
FIG. 7 shows a top view of one of the identification blocks.

The make-up of the individual de-focus strips is shown in FIG. 3. Each de-focus strip has an identification block 40 where information is contained regarding the content of the associated de-focus strip. FIG. 7 shows a top view of one of the identification blocks having an alphanumeric logo 72 and a series of dark or clear squares 74 for storing coded information. Each of the identification blocks is square having a width 24 of between about 16 and 24 micrometers.

Referring again to FIG. 3, the remainder of the de-focus strip is made-up of a set of test patterns, in this example the set of test patterns contains 6 test patterns. Each test pattern is contained in a square pattern block, 41, 42, 43, 44, 45, and 46 having a width of between about 16 and 24 micrometers. A number of spacers 14, in this example 5, separate the test patterns with no spacer between the identification block 40 and the adjacent pattern block 41. The spacers are rectangles having a width of between about 1 and 3 micrometers and a length of between about 16 and 24 micrometers.

Figure 4:
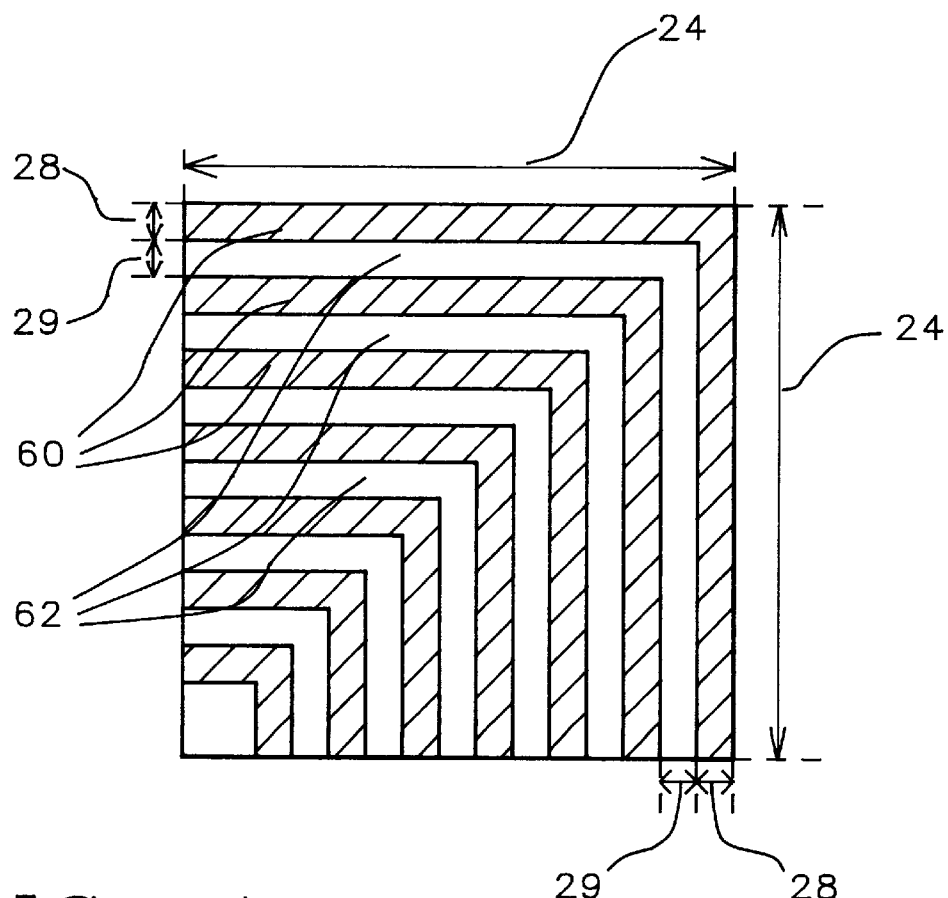
FIG. 4 shows a top view of one of the test patterns using closely spaced parallel lines having a 90° bend in the lines.
Figure 5:
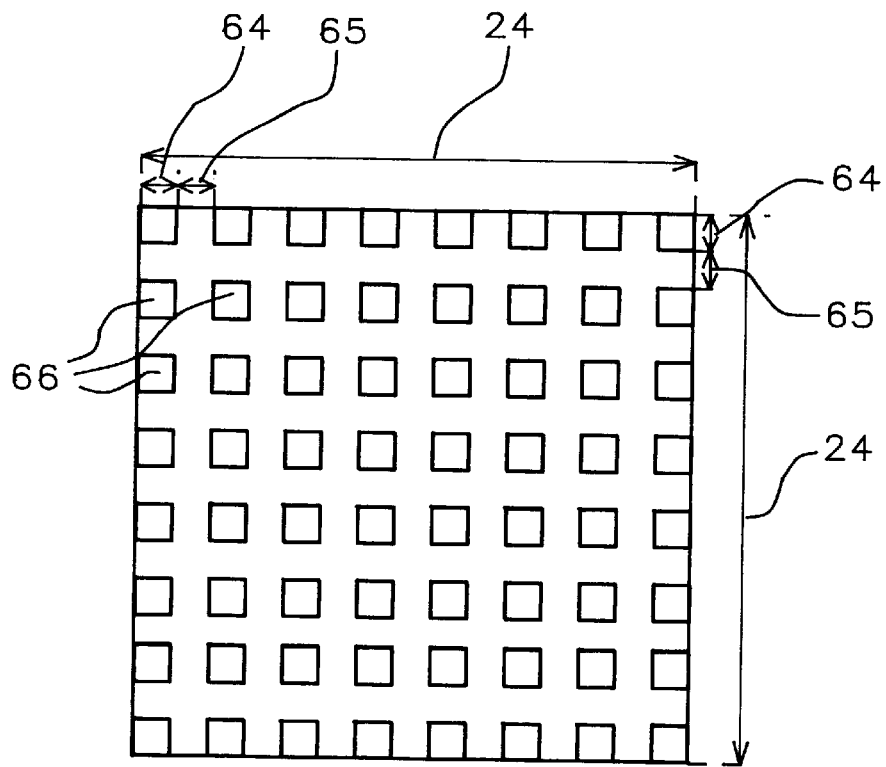
FIG. 5 shows a top view of one of the test patterns using an array of square contacts.
Figure 6:
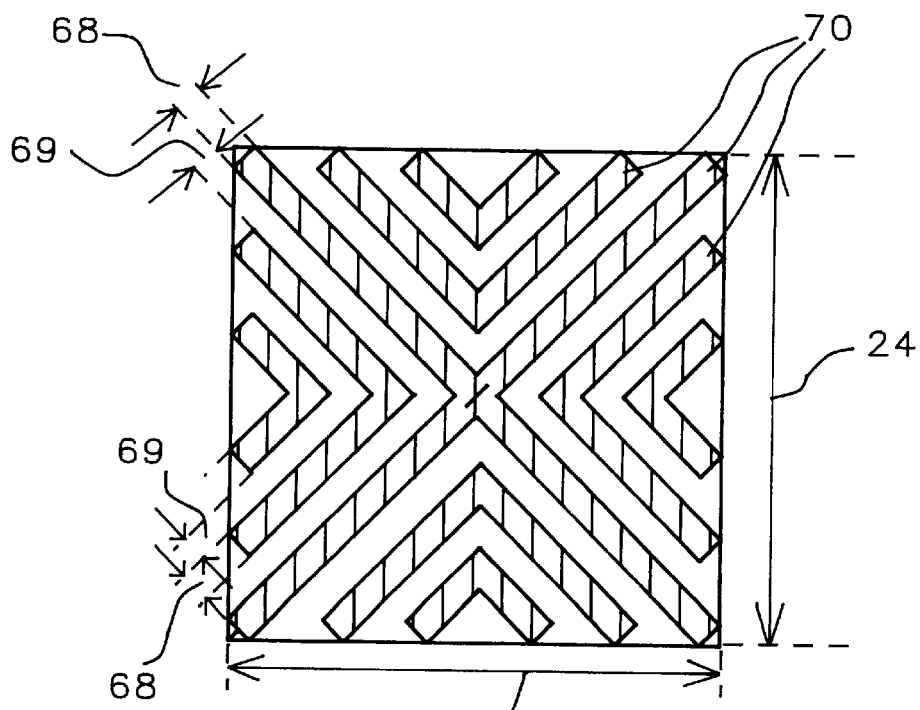
FIG. 6 shows a top view of one of the test patterns using closely spaced parallel lines having a V shape.

Refer now to FIGS. 4–6 for examples of test patterns used to make up the de-focus strips. FIG. 4 shows a pattern of closely spaced lines 60 and spaces 62 having a 90° bend in each line. The line width 28 and the separation 29 between adjacent lines are equal. In a first type of de-focus strip six of the test patterns shown in FIG. 4 are used. The six test patterns have line widths and spacings of about 0.60 micrometers, 41 in FIG. 3, about 0.55 micrometers, 42 in FIG. 3, about 0.50 micrometers, 43 in FIG. 3, about 0.45 micrometers, 44 in FIG. 3, about 0.40 micrometers, 45 in FIG. 3, and about 0.35 micrometers, 46 in FIG. 3. Line widths and spacings of between about 0.30 and 0.75 micrometers can be used. Sufficient lines are used to fill each test pattern block.

FIG. 5 shows an array of squares 66 arranged in rows and columns. The width 64 of each square and the spaces 65 between nearest sides of adjacent squares are equal. In a second type of de-focus strip six of the test patterns shown in FIG. 5 are used. The six test patterns have widths 64 and spacings 65 of about 0.60 micrometers, 41 in FIG. 3, about 0.55 micrometers, 42 in FIG. 3, about 0.50 micrometers, 43 in FIG. 3, about 0.45 micrometers, 44 in FIG. 3, about 0.40 micrometers, 45 in FIG. 3, and about 0.35 micrometers, 46 in FIG. 3. Widths and spacings of between about 0.30 and 0.75 micrometers can be used. Sufficient squares are used to fill each pattern block.

FIG. 6 shows a pattern of closely spaced lines 70 and spaces 62 having a V shape. The line width 68 and the separation 69 between adjacent lines are equal. In a third type of de-focus strip three of the test patterns shown in FIG. 4 are used; having line widths and spacings of about 0.70 micrometers, 41 in FIG. 3, about 0.60 micrometers, 42 in FIG. 3, and about 0.50 micrometers, 43 in FIG. 3; and three of the test patterns shown in FIG. 6 are used; having line widths and spacings of, about 0.70 micrometers, 44 in FIG. 3, about 0.60 micrometers, 45 in FIG. 3, and about 0.50 micrometers, 46 in FIG. 3. Line widths and spacings of between about 0.45 and 0.75 micrometers can be used. Sufficient lines are used to fill each test pattern block.

The first type of de-focus strip is used for lower level or front end type line patterns, the second type of de-focus strip is used for contact holes, and the third type of de-focus strip is used for higher level or back end type metal lines. Each of the test patterns in one of the de-focus strips is formed in a single plane at a characteristic distance, $d_x$, above the first surface of the integrated circuit wafer 10, see FIG. 10 which shows a cross section view of the de-focus strip show in FIG. 3. When a number of different de-focus strips are formed together in a de-focus pattern, see FIG. 2, test patterns of a number of different types, different characteristic distances, different line width and spacings, and different square pattern width anti separations are available to evaluate the de-focus and tilt characteristics of the de-focus pattern.

Figure 8:
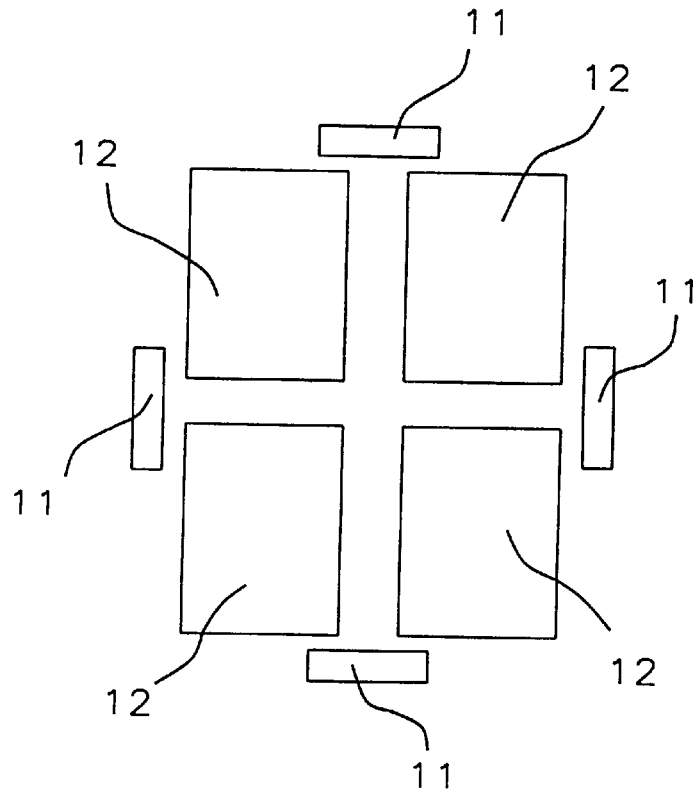
FIG. 8 shows a top view of four integrated circuit chips with four dec-focus test patterns located around them.

As shown in FIG. 8, the de-focus patterns are then placed in the spaces between groups of circuit chips on the integrated circuit wafer, in this example groups of 4. As shown in FIG. 1, the de-focus patterns are placed over the entire wafer. The de-focus patterns are formed at the same time as the features on the circuit chips and serve as an in-line monitor for photo processing steps.

Figure 9:
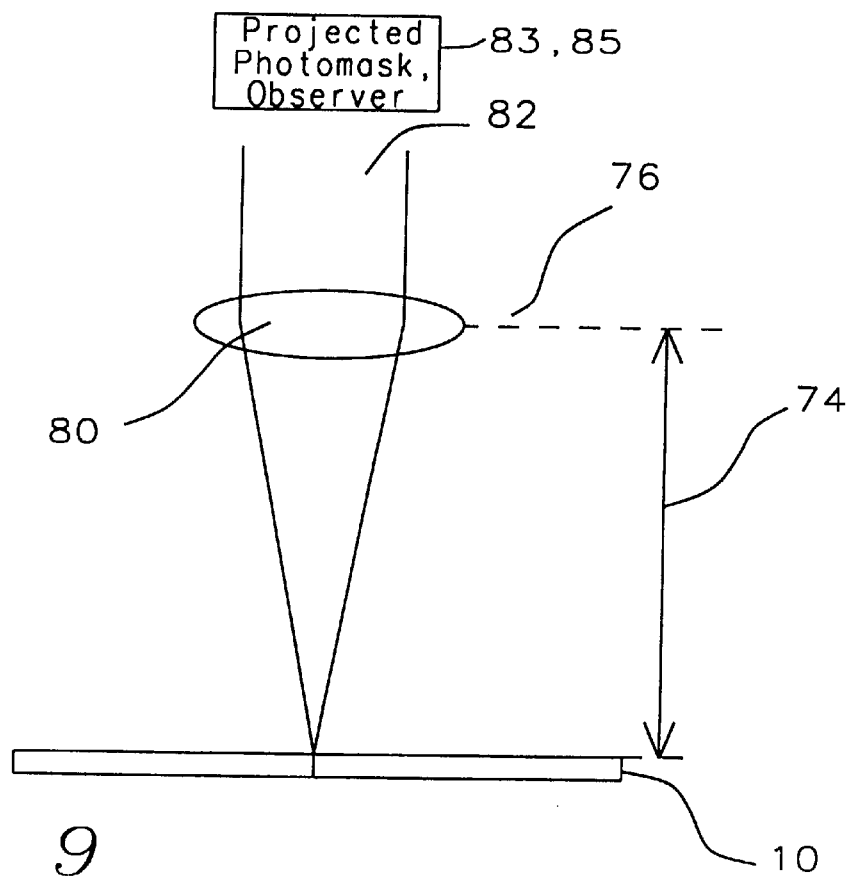
FIG. 9 shows a diagram of an optical system used to measure the focus height of the photo mask pattern.
Figure 10:
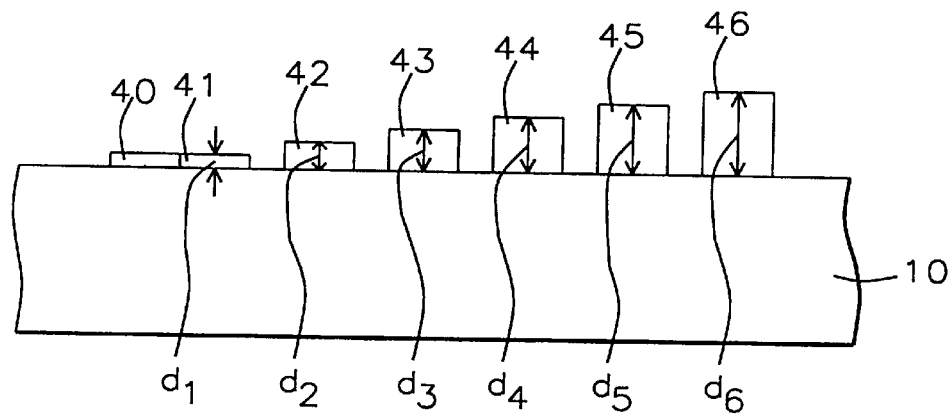
FIG. 10 shows a cross section view of the de-focus strip of FIG. 3.
Figure 11:
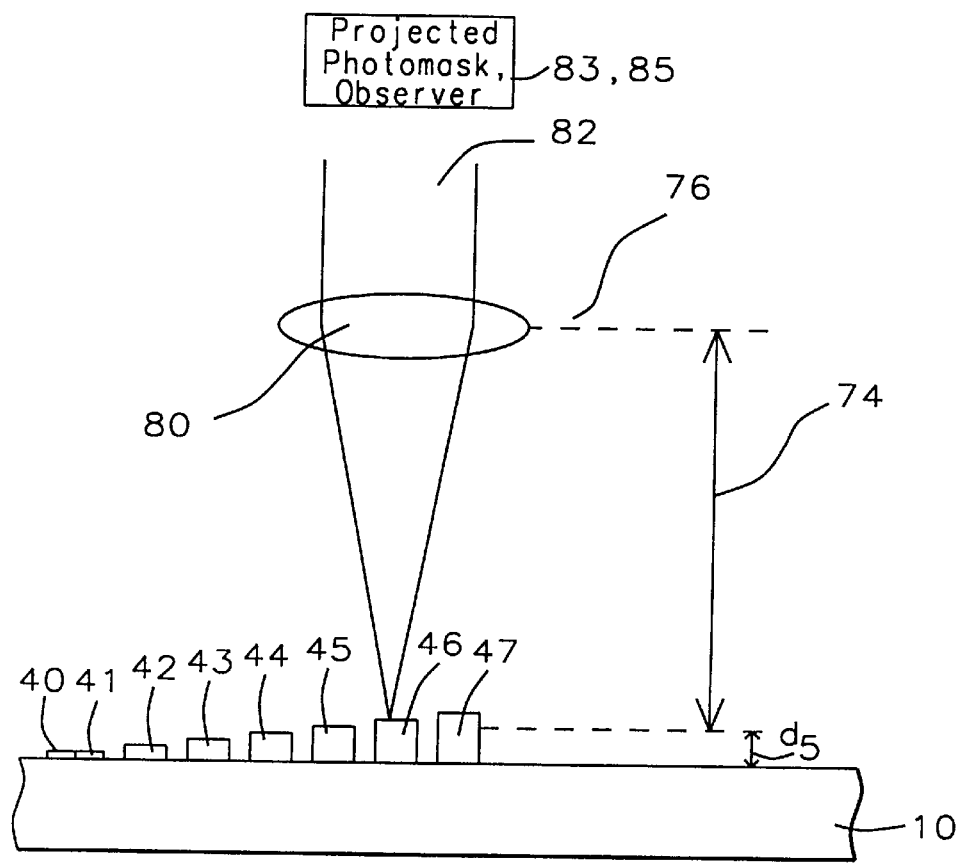
FIG. 11 shows a diagram of an optical system used to measure the focus height of the test patterns.

Refer now to FIGS. 9–11 for a description of an embodiment of a method of using the de-focus patterns described above as an in-line monitor of photo processing steps. FIGS. 9 and 11 shows a schematic diagrams of an optical system for either measuring the de-focus characteristics of a wafer or of exposing a photo mask pattern on a wafer. FIG. 10 shows a cross section view of the de-focus strip shown in FIG. 3. The optical system has a lens system 80 for focusing an incident beam of light 82 on the integrated circuit wafer 10. The lens system is in the reference plane 76 of the optical system. The optical system determines the focus distance 74 to either focus the photo mask pattern on the integrated circuit wafer, see FIG. 9, or to focus the test patterns in a selected de-focus strip of the de-focus pattern described above, see FIG. 11.

As shown in FIGS. 9 and 11, either a photomask 83 to be projected onto the wafer, or a means 85, for example an observer, for observing an image on the wafer can be interchangeably placed above the lens system. This focus distance information provides de-focus and tilt information required for an in-line photo process monitor. A scanning electron microscope, SEM, can also be used to analyze the de-focus information.

While the invention has been particularly shown and described with reference to the preferred embodiments thereof, it will be understood by those skilled in the art that various changes in form and details may be made without departing from the spirit and scope of the invention.

What is claimed is:

1. A method of monitoring in-line photo de-focus, comprising the steps of:

providing an integrated circuit wafer having a first surface and a plurality of circuit chips arranged in horizontal rows and vertical columns;

providing an optical system having a reference plane whereby patterns located a first focus distance from said reference plane are in focus;

providing vertical spaces between adjacent said vertical columns of circuit chips;

providing horizontal spaces between adjacent said horizontal rows of circuit chips;

providing a first number of identification blocks;

providing a second number of de-focus strips wherein each of said de-focus strips comprises one of said identification blocks and a third number of test patterns wherein each of said test patterns in each of said de-focus strips is formed in a single plane at a characteristic distance above said first surface of said integrated circuit wafer;

locating said second number of de-focus strips on said first surface of said integrated circuit wafer in said vertical spaces and said horizontal spaces; and observing said first focus distance for each of said test patterns using said optical system.

2. The method of claim 1 wherein said third number is six.

3. The method of claim 1 wherein said characteristic distance is between about 0 and 16,400 micrometers.

4. The method of claim 1 wherein said test pattern comprises a series of lines and spaces wherein the width of said lines is substantially equal to the width of the spaces between adjacent said lines.

5. The method of claim 4 wherein the width of said lines is between about 0.3 and 0.75 micrometers.

6. The method of claim 1 wherein said test pattern comprises an array of squares of equal width wherein said width of said squares is substantially equal to the distance between nearest sides of adjacent said squares.

7. The method of claim 6 wherein said width of said squares is between about 0.3 and 0.65 micrometers.

* * * * *